US012173426B2

(12) United States Patent
Lee et al.

(10) Patent No.: US 12,173,426 B2
(45) Date of Patent: Dec. 24, 2024

(54) RAW MATERIAL SUPPLY UNIT, AND APPARATUS COMPRISING SAME FOR GROWING SINGLE-CRYSTAL SILICON INGOT

(71) Applicant: SK SILTRON CO., LTD., Gyeongsangbuk-do (KR)

(72) Inventors: Young Jung Lee, Gyeongsangbuk-do (KR); Yun Gwang Shin, Gyeongsangbuk-do (KR)

(73) Assignee: SK SILTRON CO. LTD., Gyeongsangbuk-Do (KR)

( * ) Notice: Subject to any disclaimer, the term of this patent is extended or adjusted under 35 U.S.C. 154(b) by 147 days.

(21) Appl. No.: 17/771,048

(22) PCT Filed: Feb. 5, 2020

(86) PCT No.: PCT/KR2020/001649
§ 371 (c)(1),
(2) Date: Apr. 22, 2022

(87) PCT Pub. No.: WO2021/080093
PCT Pub. Date: Apr. 29, 2021

(65) Prior Publication Data

US 2022/0364259 A1 Nov. 17, 2022

(30) Foreign Application Priority Data

Oct. 22, 2019 (KR) ........................ 10-2019-0131174

(51) Int. Cl.
*C30B 15/08* (2006.01)
*C30B 15/10* (2006.01)
(Continued)

(52) U.S. Cl.
CPC .............. *C30B 15/08* (2013.01); *C30B 15/10* (2013.01); *C30B 15/30* (2013.01); *C30B 35/005* (2013.01); *Y10T 117/1056* (2015.01)

(58) Field of Classification Search
CPC ...................................................... C30B 29/06
See application file for complete search history.

(56) References Cited

U.S. PATENT DOCUMENTS

2014/0360428 A1* 12/2014 Jang ........................ C30B 15/02 117/214

FOREIGN PATENT DOCUMENTS

CN 101135061 3/2008
CN 104641024 5/2015
(Continued)

OTHER PUBLICATIONS

Chinese Office Action dated Mar. 24, 2023 issued in Application No. 202080089244.5.
(Continued)

*Primary Examiner* — Hua Qi
(74) *Attorney, Agent, or Firm* — KED & ASSOCIATES, LLP

(57) ABSTRACT

Provided is a raw material supply unit comprising: a main body having a space into which raw material is filled; a barrier for dividing the main body into two or more areas in the longitudinal direction; a rod extending from above the main body into the interior of same; and a valve, connected to the rod, for covering or exposing the lower portion of the main body, wherein the bottom surface of the main body has a step.

3 Claims, 18 Drawing Sheets

120
130
140
150
110
100
Second side
First side
THROUGH-HOLE
two regions
160
180
SECOND INCLINED SURFACE
FIRST INCLINED SURFACE
BOTTOM SURFACE
SECOND PORTION
FIRST PORTION

(51) Int. Cl.
*C30B 15/30* (2006.01)
*C30B 35/00* (2006.01)

(56) References Cited

FOREIGN PATENT DOCUMENTS

| | | | |
|---|---|---|---|
| JP | 08-124855 | | 5/1996 |
| JP | 2006-248571 | | 9/2006 |
| JP | 2008-285410 | | 11/2008 |
| JP | 2008285351 A | * | 11/2008 |
| KR | 10-2005-0120707 | | 12/2005 |
| KR | 10-2013-0079830 | | 7/2013 |
| KR | 10-2016-0052141 | | 5/2016 |
| KR | 10-1820681 | | 1/2018 |
| KR | 10-2018-0081932 | | 7/2018 |

OTHER PUBLICATIONS

International Search Report dated Jul. 21, 2020 issued in Application No. PCT/KR2020/001649.
Korean Notice of Allowance dated Jul. 26, 2021 issued in Application No. 10-2019-0131174.

* cited by examiner

RAW MATERIAL SUPPLY UNIT, AND APPARATUS COMPRISING SAME FOR GROWING SINGLE-CRYSTAL SILICON INGOT

CROSS-REFERENCE TO RELATED PATENT APPLICATIONS

This application is a U.S. National Stage Application under 35 U.S.C. § 371 of PCT Application No. PCT/KR2020/001649, filed Feb. 5, 2020, which claims priority to Korean Patent Application No. 10-2019-0131174, filed Oct. 22, 2019, whose entire disclosures are hereby incorporated by reference.

TECHNICAL FIELD

Embodiments relate to a raw material supply unit and a single-crystal silicon ingot growth apparatus including the same, and more particularly to a raw material supply unit capable of evenly supplying a raw material to a crucible of a single-crystal silicon ingot growth apparatus, thereby simplifying a process and securing process stability, and a single-crystal silicon ingot growth apparatus including the same.

BACKGROUND ART

A substrate used to manufacture a semiconductor device, a solar cell, etc. is mainly a single-crystal wafer. In particular, a single-crystal silicon wafer is widely used. The single-crystal wafer is generally manufactured by growing a single-crystal ingot from a seed and slicing the single-crystal ingot.

As shown in FIG. 1, a single-crystal growth apparatus for manufacturing a single-crystal ingot includes a crucible 20, into which a polycrystalline raw material S is introduced so as to be melted, and a heating unit 30 configured to heat the crucible 20 such that the raw material S is melted into silicon melt L, and a raw material supply unit is provided above the crucible 20.

In the raw material supply unit, a body 10 having a space defined therein may be filled with the raw material S, such as polysilicon, and a valve 40 is provided under a rod 50 so as to open and close a lower part of the body 10. The body 10 may be used when the raw material S is initially introduced into the crucible 20, and may also be used when the crucible 20 containing the silicon melt L is refilled with a raw material S. Consequently, the raw material supply unit may be called a filling apparatus.

In order to supply the raw material S to the crucible 20, the body 10 may be moved downwards by a pulling-up means (not shown) so as to be adjacent to the crucible 20.

However, the conventional raw material supply unit has the following problems.

As shown in FIG. 1, the valve 40 is provided under the body 10. When the valve 40 is moved downwards, the raw material S may be injected in a direction toward the silicon melt L in the crucible 20 through a space between the valve 40 and the main body 10.

At this time, when the size of the body 10 is increased, the amount of the raw material S in the body is increased, whereby a large amount of the raw material S may be supplied to the crucible 20 at once. However, when the valve 40 under the body 10 is opened and a large amount of the raw material S in the body 10 is supplied to the silicon melt L in the crucible 20 at once, the silicon melt L may splash at the surface thereof.

In order to prevent such a splashing phenomenon, a method of closing the valve 40 under the body 10 during supply of the raw material S may be considered. However, the raw material S may collide with the lower surface of the body 10 and the valve 40 therebetween, whereby the body 10 and the valve 40 may be broken.

Consequently, a process of completely supplying a raw material S to the crucible 20 using a body 10 having a relatively small inner volume, filling the body 10 with a raw material S, and supplying the raw material S to the crucible 20 may be repeatedly performed several times.

In a polycrystalline silicon ingot growth process, therefore, polysilicon injected into the crucible as the raw material S is melted, the raw material supply unit is refilled with polysilicon, and the polysilicon is supplied to the crucible again, whereby the process may be complicated and process time may be lengthened.

DISCLOSURE

Technical Problem

Embodiments simplify a process of supplying a raw material to a crucible in a single-crystal silicon ingot growth apparatus and shorten process time.

Technical Solution

An embodiment provides a raw material supply unit including a body having a space configured to be filled with a raw material, a partition configured to divide the body into at least two regions in a longitudinal direction, a rod extending from above the body to an inner region of the body so as to be disposed in the body, and a valve connected to the rod, the valve being configured to open and close a lower part of the body, wherein a lower surface of the body has a step.

Another embodiment provides a raw material supply unit including a body having a space configured to be filled with a raw material, a rod extending from above the body to an inner region of the body so as to be disposed in the body, and a valve connected to the rod, the valve being configured to open and close a lower part of the body, wherein a bottom surface of the valve has a step.

A further embodiment provides a single-crystal silicon ingot growth apparatus including a chamber, a crucible provided in the chamber, the crucible being configured to receive silicon melt, a heating unit configured to heat the crucible, a heat shielding material provided above the crucible, a magnetic field generator configured to apply a magnetic field to the crucible, a rotary shaft configured to rotate the crucible so as to be moved upwards, and the raw material supply unit, wherein the raw material supply unit is provided above the crucible.

Advantageous Effects

In a raw material supply unit according to an embodiment and a single-crystal silicon ingot growth apparatus including the same, a lower surface of a body of the raw material supply unit or a bottom surface of a valve may have a step structure, whereby a raw material in some regions of the body may be supplied to silicon melt in a crucible and then a raw material in the other regions of the body may be supplied to the silicon melt in the crucible.

Consequently, a raw material may be supplied through some regions and then the raw material may be supplied through other regions using a body having a larger volume than before, whereby the raw material supply unit may not be replaced during supply of the raw material or the raw material supply unit may not be refilled with a raw material, and therefore a raw material supply process may be simplified and process time may be shortened.

BEST MODE

Embodiments will be described in order to specifically explain the present disclosure, and the embodiments will be described in detail with reference to the accompanying drawings for assisting in understanding of the present disclosure.

However, embodiments of the present disclosure may be modified in various different forms, and the scope of the present disclosure is not limited to the following embodiments. Embodiments of the present disclosure are provided merely to more completely explain the present disclosure to a person having average knowledge in the art to which the present disclosure pertains.

In addition, relational terms, such as "first," "second," "above," and "under," may be used only to distinguish between one subject or element and another subject or element without necessarily requiring or involving any physical or logical relationship or sequence between such subjects or elements.

Figure 1:
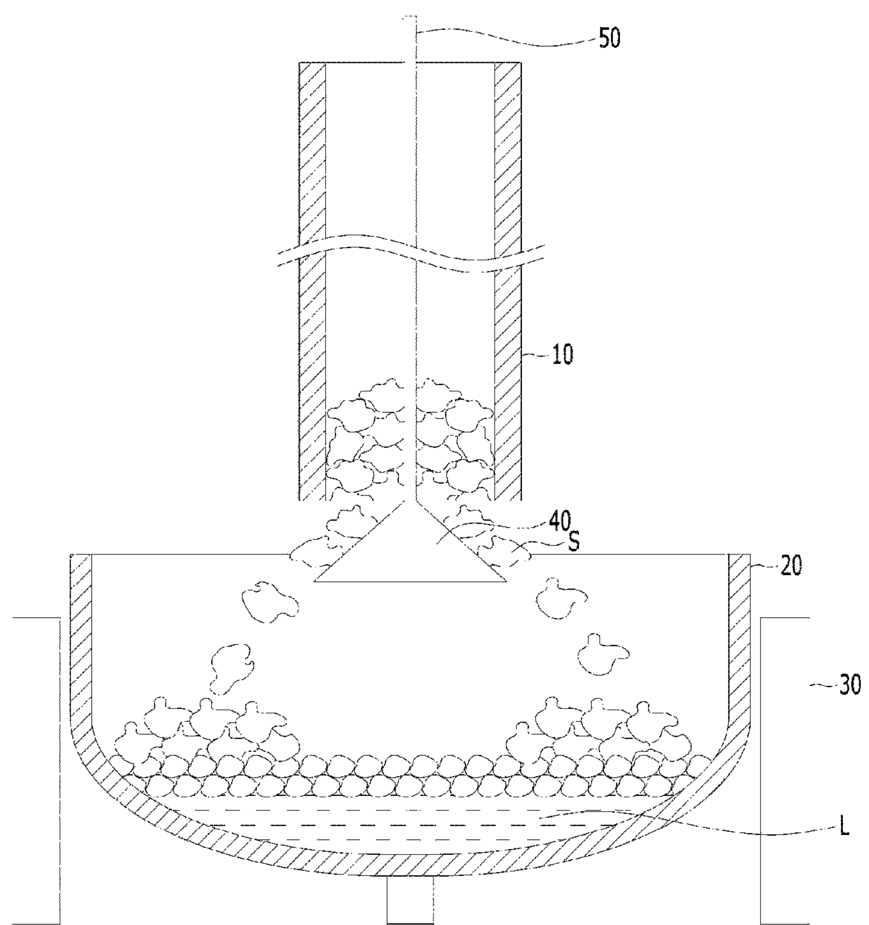
FIG. 1 is a view showing a conventional raw material supply unit and a conventional single-crystal silicon ingot growth apparatus.
Figure 2:
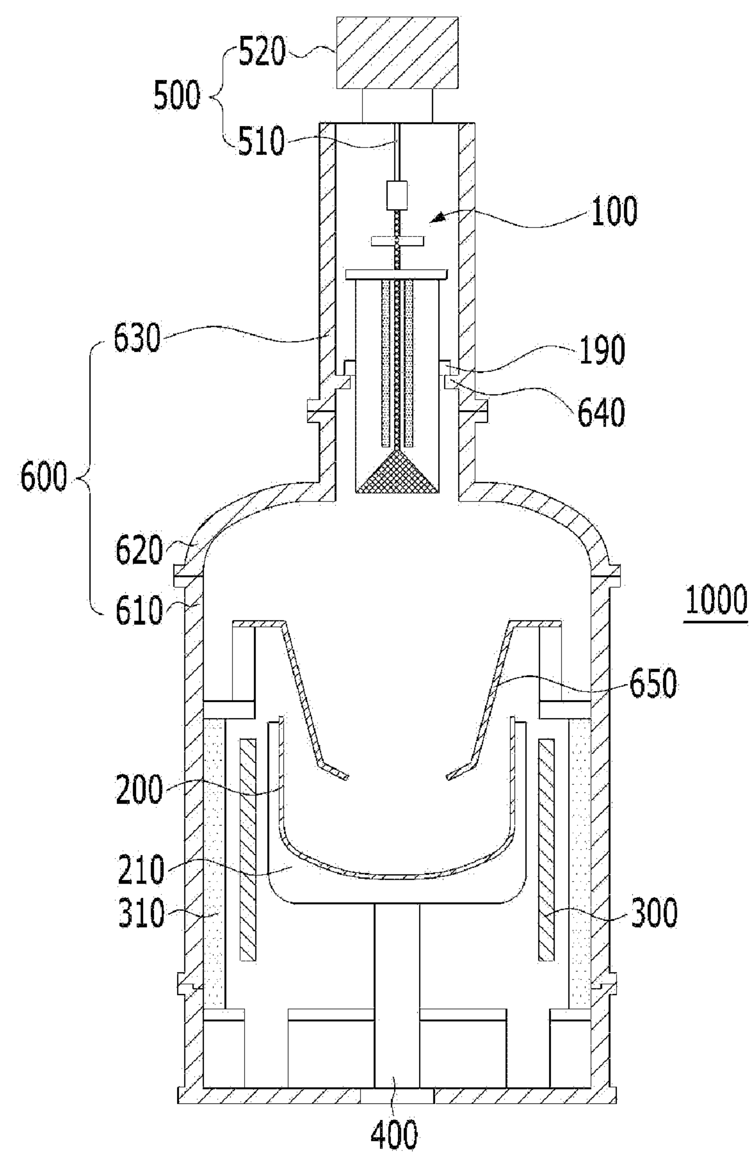
FIG. 2 is a view showing an embodiment of a single-crystal silicon ingot growth apparatus according to the present disclosure.

FIG. 2 is a view showing an embodiment of a single-crystal silicon ingot growth apparatus according to the present disclosure. Hereinafter, the embodiment of the single-crystal silicon ingot growth apparatus according to the present disclosure will be described with reference to FIG. 2.

The single-crystal silicon ingot growth apparatus 1000 according to this embodiment may include a chamber 600, a crucible 200 provided in the chamber 600, the crucible being configured to receive silicon melt, a heating unit 300 configured to heat the crucible 200, a heat shielding material 650 provided above the crucible 200, a magnetic field generator (not shown) configured to apply a magnetic field to the crucible 200, a rotary shaft 400 configured to rotate the crucible 200 so as to be moved upwards, and a raw material supply unit 100 provided above the crucible 200.

The chamber 600 may include a body chamber 610, a dome chamber 620, and a pull chamber 630 depending on coupling positions thereof.

The crucible 200 may be installed in the body chamber 610, and the dome chamber 620 may form a cover at an upper end of the body chamber 610. Each of the body chamber 610 and the dome chamber 620, which is a place that provides an environment necessary to grow a polysilicon raw material into a single-crystal silicon ingot, may be a cylinder having a receiving space therein. The pull chamber 630 may be located at an upper end of the dome chamber 620, and may be a space in which the grown single-crystal silicon ingot is pulled up.

The chamber 600 may have a support protrusion 640 protruding from an inner wall thereof in a horizontal direction and a heat shielding material 650 provided above the crucible 200. For example, the support protrusion 640 may protrude from an inner wall of the pull chamber 630 in the horizontal direction. The support protrusion 640 may support a catching protrusion 190 of the raw material supply unit 100.

After the catching protrusion 190 of the raw material supply unit 100 is supported by the support protrusion 640 of the chamber 600, a valve may be moved downwards by a pulling-up means 500, and a lower part of a body of the raw material supply unit 100 may be gradually opened.

The crucible 200 may be disposed in the body chamber 610, and may be supported by a crucible support 210 located under the crucible 200. The crucible 200 may have a structure that is rotatable while being filled with a raw material. The heating unit 300 may be disposed in the body chamber 610 so as to be spaced apart from an outer circumferential surface of the crucible 200. When the crucible 200 is heated by the heating unit 300, the raw material in the crucible 200 may be changed into silicon melt.

A heat insulator 310 may be installed between the heating unit 300 and an inner wall of the body chamber 610, and may prevent heat of the heating unit 300 from leaking out of the body chamber 610.

The pulling-up means 500 may include a fixing portion 510 configured to fix and support a target that is grown or the raw material supply unit 100 and a pulling-up portion 520 configured to upwardly or downwardly move a grown target (e.g. a single-crystal ingot) or a valve of the raw material supply unit 100, a description of which will follow.

The fixing portion 510 may be of a cable type or a shaft type, and a seed chuck (not shown) may be provided at one end of the fixing portion. The pulling-up portion 520 may upwardly or downwardly move the raw material supply unit 100 connected to the fixing portion using a motor.

After the supply of the raw material is finished and the raw material supply unit 100 is separated from the chamber 600, a seed may be connected to the seed chuck (not shown) for single-crystal growth.

A first embodiment of the raw material supply unit may include a body having a space configured to be filled with a raw material, a partition configured to divide the body into at least two regions in a longitudinal direction, a rod extending from above the body to an inner region of the body so as to be disposed in the body, and a valve connected to the rod, the valve being configured to open and close a lower part of the body, wherein a bottom surface of the valve may be flat and a lower surface of the body may have a step.

The lower surface of the body may include at least two regions having different heights, and a border between the at least two regions may overlap the partition in a vertical direction.

A height difference of the lower surface of the body may be 30 mm to 70 mm.

The lower surface of the body may include a first portion having a first height and a second portion having a second height greater than the first height, wherein the area of the lower surface of the body surrounded by the first portion and the area of the lower surface of the body surrounded by the second portion may be equal to each other.

The valve may have a conical shape, the conical shape may include a first inclined surface and a second inclined surface, and the first inclined surface and the second inclined surface of the conical shape may overlap the first portion and the second portion of the body in the vertical direction, respectively.

A first angle between the bottom surface of the valve and the first inclined surface may be greater than or equal to a second angle between the bottom surface of the valve and the second inclined surface.

The lower surface of the body may further include a third portion having the first height and a fourth portion having the second height, wherein the first portion and the third portion may be disposed in symmetry with respect to the center of the body in a horizontal direction, and the second portion and the fourth portion may be disposed in symmetry with respect to the center of the body in the horizontal direction.

Figure 3:
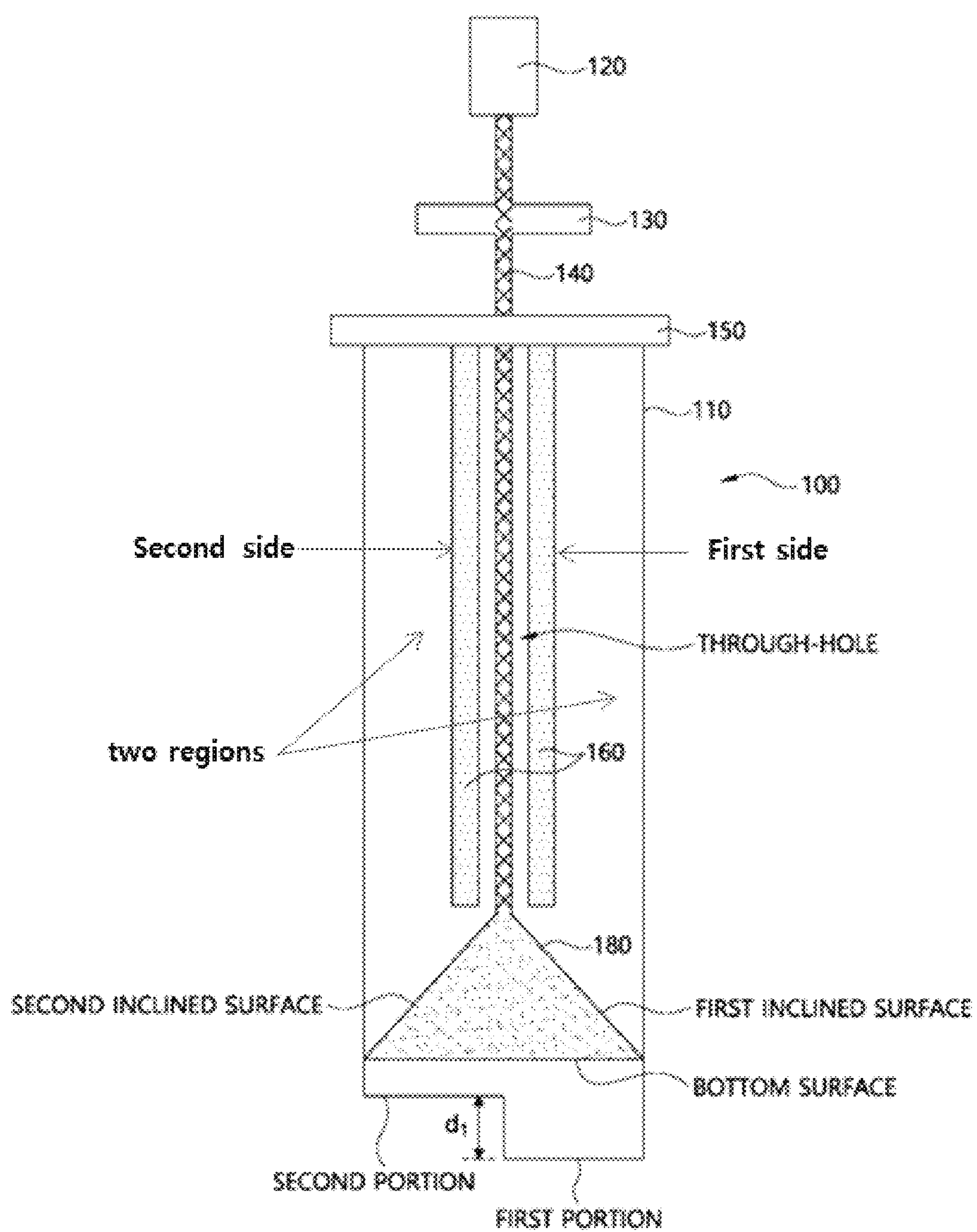
FIG. 3 is a view showing a first embodiment of a raw material supply unit.

FIG. 3 is a view showing a first embodiment of the raw material supply unit. Hereinafter, the first embodiment of the raw material supply unit will be described with reference to FIG. 3.

The raw material supply unit 100 according to the embodiment may include a body 110 having a space configured to be filled with a raw material, a rod 140 extending from above the body 110 to an inner region of the body 110 so as to be disposed in the body, and a valve 180 connected to the rod 140, the valve being disposed under the rod 140 so as to open and close a lower part of the body 110. A partition 160 configured to divide the body 110 into at least two regions in the longitudinal direction may be provided in the body 110.

Each of the body 110 and the valve 180 may include quartz glass, which exhibits high corrosion resistance, durability, and purity. The body 110 may be open at an upper surface and a lower surface thereof, and may have a space configured to be filled with a raw material (not shown) therein. For example, the body may have a cylindrical shape. The open upper surface of the body 110 may be closed by a cover 150, and the open lower surface of the body may be closed by the valve 180. The cover 150 may be provided in one or in plural, and may have any of various shapes, such as a cross shape, in addition to a bar shape.

The rod 140 may be connected to a seed chuck 120 disposed above the body 110. At this time, a stopper 130 may be provided at an upper region of the rod 140. The stopper 130 may protrude relative to the rod 140 in a lateral direction to stop operation of the pulling-up means 500 when contacting the cover 150 provided above the body 110.

When the raw material supply unit 100 of FIG. 3 is introduced into the single-crystal silicon ingot growth apparatus of FIG. 2, one end of the rod 140 may be connected to the pulling-up means 500 of the single-crystal silicon ingot growth apparatus 1000, and may be inserted into the body 110 of the raw material supply unit 100. For example, the rod 140 may include a bar, cable, or rope disposed in the body 110 so as to extend along the center of the body in the vertical direction. In addition, the rod 140 may be made of a metal alloy including molybdenum, which exhibits high corrosion resistance and heat resistance, or tungsten, which is resistant to heat and pressure and exhibits high hardness.

The valve 180 may have a conical shape. Here, the conical shape may mean a cone having a circular lower surface. The valve 180 may be constituted by a flat lower surface and first and second inclined surfaces. Although the first and second inclined surfaces are not physically distinguished from each other, the first and second inclined surfaces may be distinguished from each other depending on the positional relationship between the first and second portions, as will be described below.

In this embodiment, the lower surface of the body 100 may have a step structure. That is, the lower surface of the body 110 may include at least two regions having different heights. A border between the at least two regions may overlap the partition 160 in the vertical direction.

In FIG. 3, the lower surface of the body 110 may be divided into a first portion and a second portion, wherein a height difference d1 between the first portion and the second portion may be 30 mm to 70 mm.

The second portion may be disposed higher than the first portion. The height at this time may be, for example, a height from an arbitrary point under the raw material supply unit 100 in the single-crystal silicon ingot growth apparatus 1000 of FIG. 2.

When the valve 180 is moved downwards by movement of the rod 140, a gap may be formed between body 110 and the first and second inclined surfaces of the valve 180, and a raw material, such as polysilicon, may be supplied under the raw material supply unit 100 through the gap. At this time, a raw material located above the second portion is completely supplied through the second portion and the second inclined surface, and then a raw material located above the first portion is completely supplied through the first portion and the first inclined surface, due to the height difference d1 between the first portion and the second portion. At this time, the partition 160 may prevent the raw material located above the first portion and the raw material located above the second portion from being mixed with each other or moving toward each other.

For example, when the cross section of the body 110 is circular, the partition 160 may divide the section of the body 110 into semicircular parts. A through-hole may be formed in the partition 160 in the vertical direction, and the rod 140 may be moved through the through-hole in the vertical direction.

If the height difference d1 is less than 30 mm, the raw material located above the first portion may be supplied downwards before the raw material located above the second portion is completely supplied downwards. If the height difference d1 is greater than 70 mm, a difference in supply time between the raw material located above the first portion and the raw material located above the second portion may be too great, and the movement distance of the valve 180 in the vertical direction may be unnecessarily increased.

Figure 4:
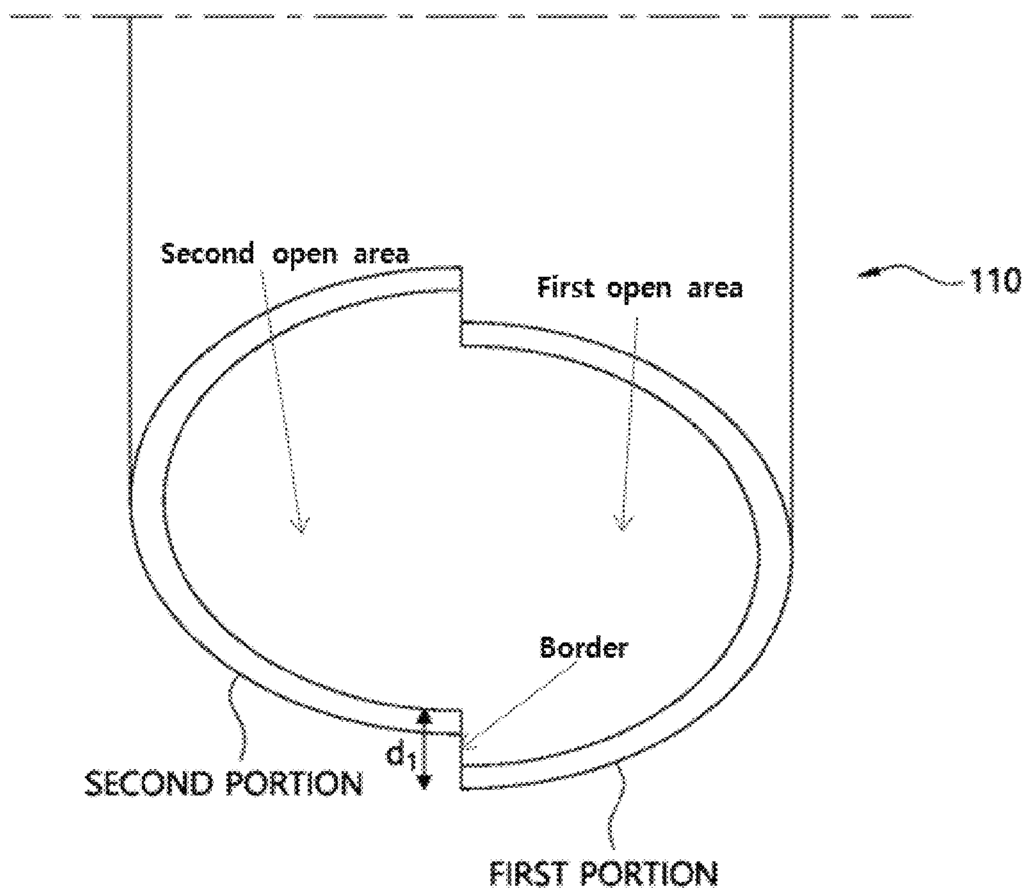
FIGS. 4 and 5 are views showing in detail a lower part of a body of the raw material supply unit of FIG. 3.
Figure 5:
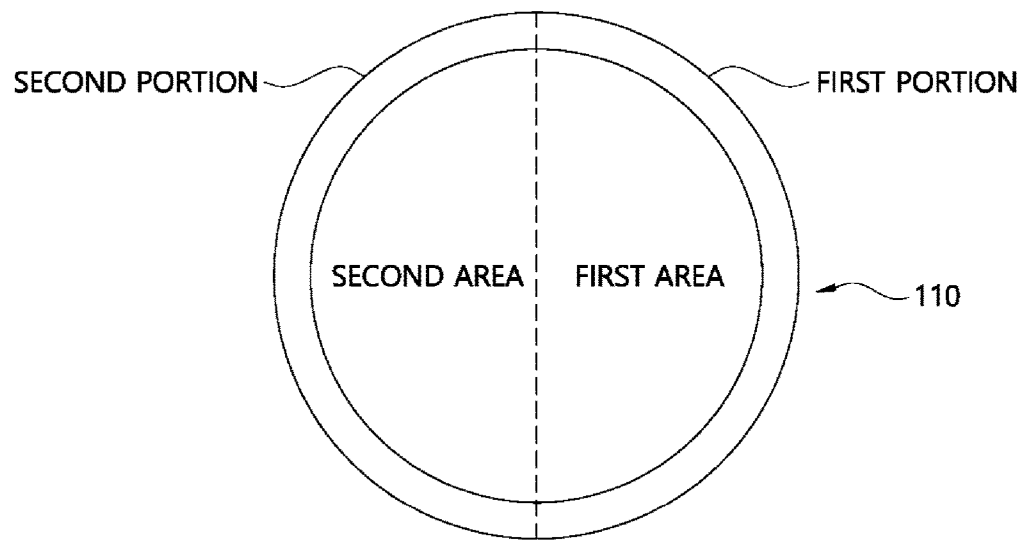

FIGS. 4 and 5 are views showing in detail the lower part of the body of the raw material supply unit of FIG. 3.

FIG. 4 is a perspective view of the lower part of the body 110, and FIG. 5 is a bottom view of the body 110. As shown, the lower part of the body 110 has a step structure. When the section of the body 110 in the lateral direction, i.e. the horizontal direction, is circular, each of the first portion and the second portion may have a semicircular shape. In FIG. 5, a first area of the lower part of the body surrounded by the first portion and a second area of the lower part of the body surrounded by the second portion may be equal to each other. That is, when a second weight of the raw material is supplied to the crucible 200 through the second portion after a first weight of the raw material is supplied to the crucible 200 through the first portion, the first weight and the second weight may be equal to each other.

Figure 6:
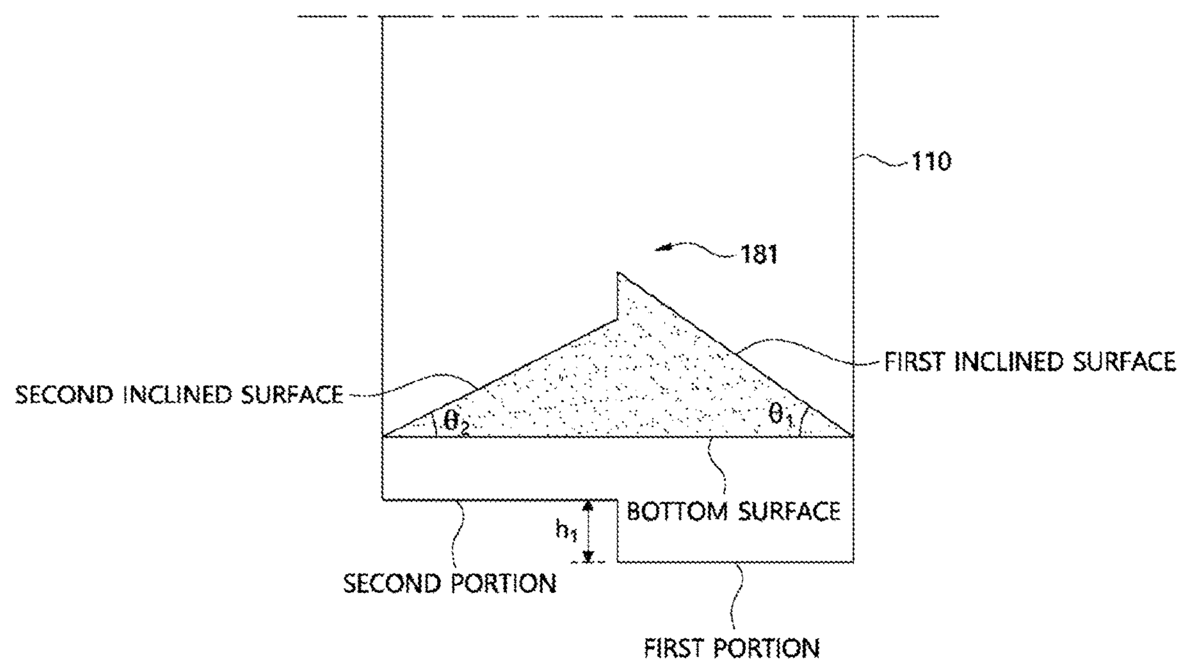
FIG. 6 is a view showing a part of a second embodiment of the raw material supply unit.

FIG. 6 is a view showing a part of a second embodiment of the raw material supply unit. This embodiment is identical to the first embodiment of the raw material supply unit of FIG. 3 except that a valve 181 having a different structure is provided.

That is, a first angle θ1 between a first inclined surface and a bottom surface of the valve 181 and a second angle θ2 between a second inclined surface and the bottom surface of the valve may be different from each other. Specifically, the first angle θ1 may be greater than the second angle θ2, or the first angle θ1 and the second angle θ2 may be equal to each other.

The first inclined surface that forms the first angle θ1 overlaps a first portion of a body in the vertical direction, and the second inclined surface that forms the second angle θ2 overlaps a second portion of the body in the vertical direction. At this time, a raw material is completely supplied to the crucible located thereunder through the second inclined surface, and the raw material is completely supplied to the crucible through the first inclined surface. In addition, when the raw material is completely supplied to the crucible located thereunder through the second portion, the raw material, i.e. polysilicon, may be relatively evenly distributed over the entire region of the surface of the silicon melt stored in the crucible, since the crucible is rotated when the raw material is supplied to the crucible. When the raw material is supplied to the crucible through the first portion, therefore, the raw material may be supplied to the crucible through the first inclined surface, which has a relatively great angle of inclination, whereby the dropping speed of the raw material may be relatively high, and therefore raw material supply time may be shortened. At this time, since polysilicon already supplied through the second inclined surface is distributed on the surface of the silicon melt, splashing of the silicon melt due to polysilicon that drops may be prevented.

In another embodiment of the raw material supply unit, the lower surface of the body 110 may have a step structure, wherein two portions having different heights may not be included but three or four portions having different heights may be provided.

When the three portions are provided, a first portion to a third portion may have different heights. In addition, as in the second embodiment, a first inclined surface to a third inclined surface that overlap the first portion to the third portion of the lower surface of the body in the vertical direction, respectively, may be provided, and when the height is gradually increased from the first portion to the third portion, an angle of inclination may be gradually decreased from the first inclined surface to the third inclined surface.

Figure 7:
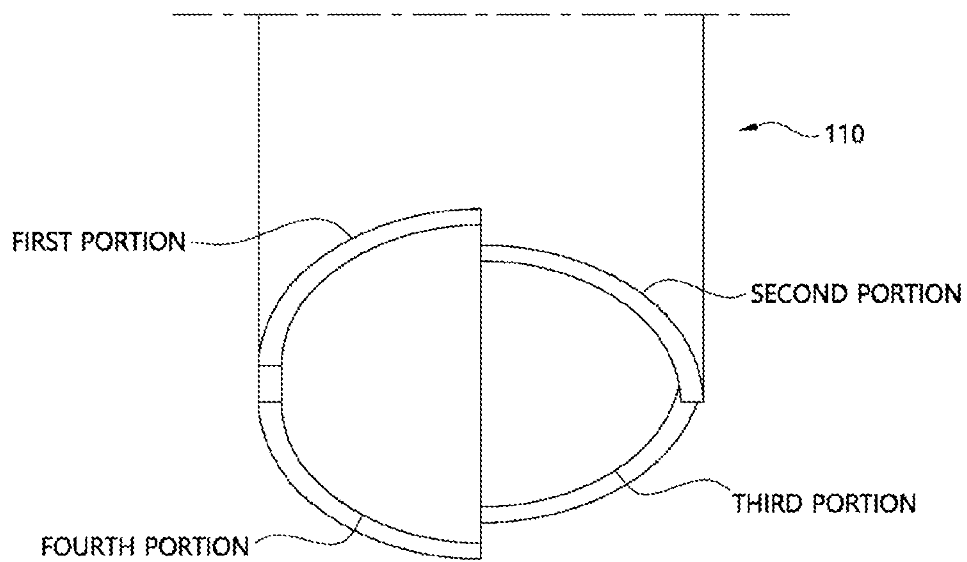
FIG. 7 is a view showing a part of a third embodiment of the raw material supply unit.
Figure 7:
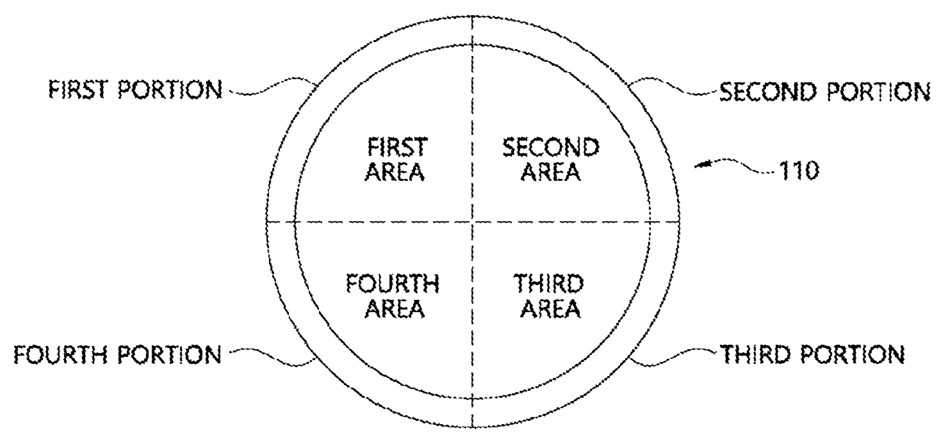

FIG. 7 is a view showing a part of a third embodiment of the raw material supply unit, specifically a lower part of a body 110.

An upper figure is a perspective view of the lower part of the body 110, and a lower figure is a bottom view of the body 110.

As shown, the lower part of the body 110 has a step structure. When the section of the body 110 in the lateral direction, i.e. the horizontal direction, is circular, each of first to fourth portions may have a fan shape having a central angle of 90 degrees (°), and first to fourth areas of the lower part of the body surrounded by the first to fourth portions, respectively, may be equal to each other. The height of the first portion may be equal to the height of the third portion, and the height of the second portion may be equal to the height of the fourth portion. That is, when a second weight of a raw material is supplied to the crucible through the second portion and the fourth portion after a first weight of the raw material is supplied to the crucible through the first portion and the third portion, the first weight and the second weight may be equal to each other. At this time, a partition may be provided in the body 110 to divide an inner space of the body 110 into four parts corresponding to the first to fourth portions.

In the above embodiments, the bottom surface of the valve in the raw material supply unit is flat, and the lower surface of the body has a step structure. In embodiments that will be described below, the bottom surface of the valve in the raw material supply unit has a step structure, and the lower surface of the body is flat.

Specifically, embodiments of the raw material supply unit that will be described below may include a body having a space configured to be filled with a raw material, a rod extending from above the body to an inner region of the body so as to be disposed in the body, and a valve connected to the rod, the valve being configured to open and close a lower part of the body, wherein a bottom surface of the valve have a step.

A lower surface of the body may be flat.

The bottom surface of the valve may include at least two inclined surfaces having different heights.

A height difference of the bottom surface of the valve may be 30 mm to 70 mm.

The bottom surface of the valve may include a first bottom surface having a first height and a second bottom surface having a second height greater than the first height, wherein the sectional area of the first bottom surface in the horizontal direction and the sectional area of the second bottom surface in the horizontal direction may be equal to each other.

The valve may have a conical shape, the conical shape may include a first inclined surface and a second inclined surface, and the first inclined surface and the second inclined surface of the conical shape may overlap the first bottom surface and the second bottom surface of the valve in the vertical direction, respectively.

A second angle between the second bottom surface and the second inclined surface may be less than or equal to a first angle between the first bottom surface and the first inclined surface.

The bottom surface of the valve may further include a third bottom surface having the first height and a fourth bottom surface having the second height, wherein the first bottom surface and the third bottom surface may be disposed in symmetry with respect to the center of the valve in the horizontal direction, and the second bottom surface and the fourth bottom surface may be disposed in symmetry with respect to the center of the valve in the horizontal direction.

The bottom surface of the valve may further include a third bottom surface having a third height greater than the second height, wherein the first bottom surface, the second bottom surface, and the third bottom surface may have the same sectional area in the horizontal direction.

In addition, raw material supply units according to embodiments that will be described below may be provided in the single-crystal silicon ingot growth apparatus shown in FIG. 2.

Figure 8:
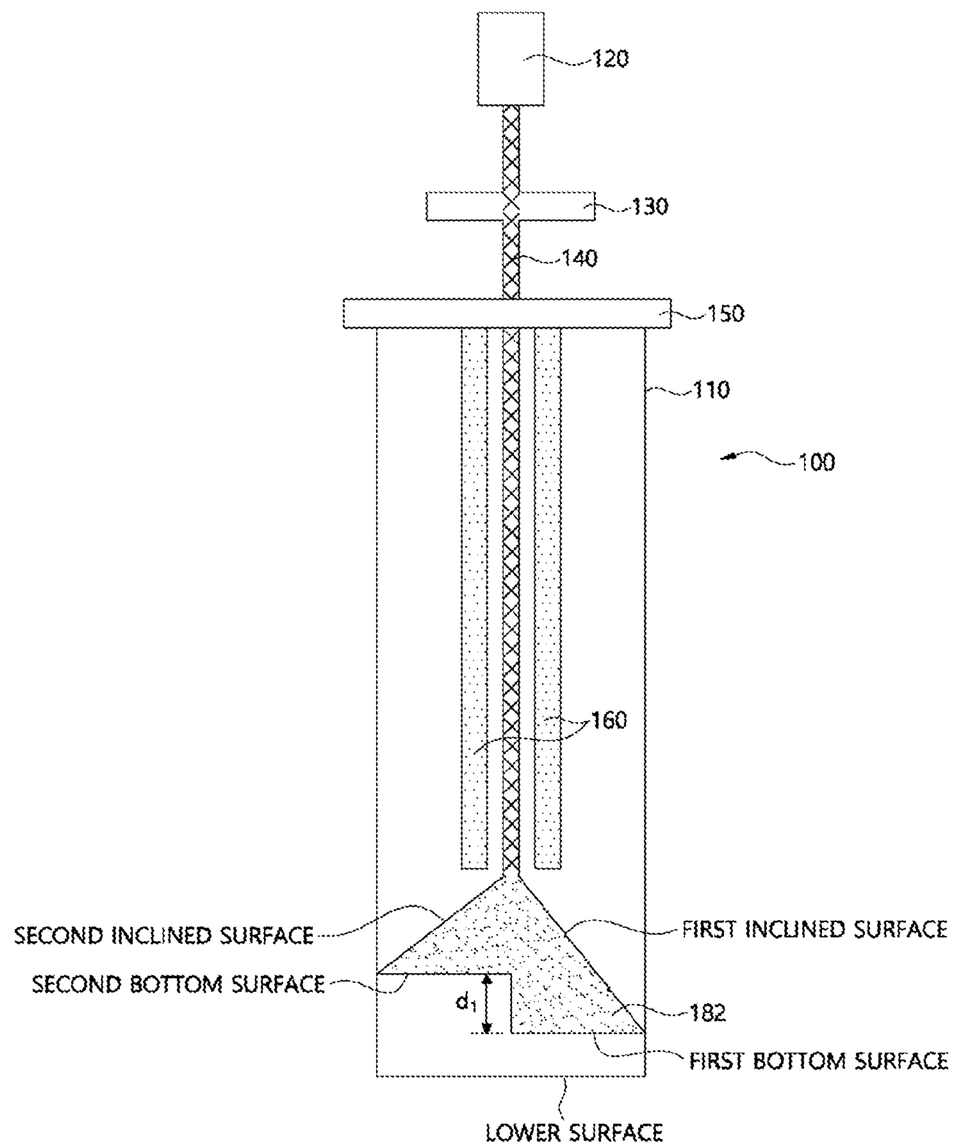
FIG. 8 is a view showing a fourth embodiment of the raw material supply unit.

FIG. 8 is a view showing a fourth embodiment of the raw material supply unit. Hereinafter, the fourth embodiment of the raw material supply unit will be described with reference to FIG. 8.

The raw material supply unit 100 according to this embodiment may include a body 110 having a space configured to be filled with a raw material, a rod 140 extending from above the body 110 to an inner region of the body 110 so as to be disposed in the body, and a valve 182 connected to the rod 140, the valve being disposed under the rod 140 so as to open and close a lower part of the body 110. A partition 160 configured to divide the body 110 into at least two regions in the longitudinal direction may be provided in the body 110. Hereinafter, a description will be given based on differences with the first embodiment shown in FIG. 3.

A lower surface of the body 110 may have no step structure and may be flat, as shown.

The valve 182 may have a conical shape, wherein a lower surface of the valve 182 may have a step. In FIG. 8, the valve 182 may include a lower surface having a first bottom surface and a second bottom surface and first and second inclined surfaces, and the first and second inclined surfaces may not be physically distinguished from each other.

A bottom surface of the valve 182 may be divided into a first bottom surface and a second bottom surface, wherein a height difference d2 between the first bottom surface and the second bottom surface may be 30 mm to 70 mm. For example, the second bottom surface may be disposed higher than the first bottom surface.

When the valve 182 is moved downwards by movement of the rod 140, a gap may be formed between body 110 and the first and second inclined surfaces of the valve 182, and a raw material, such as polysilicon, may be supplied under the raw material supply unit 100 through the gap. At this time, a raw material located above the first inclined surface of the valve 182 is completely supplied through the lower surface of the body 110 and the first inclined surface, and then a raw material located above the second inclined surface is completely supplied through the lower surface of the body 110 and the second inclined surface, due to the height difference d2 between the first bottom surface and the second bottom surface. At this time, the partition 160 may prevent the raw material located above the first inclined surface and the raw material located above the second inclined surface from being mixed with each other or moving toward each other.

Figure 9:
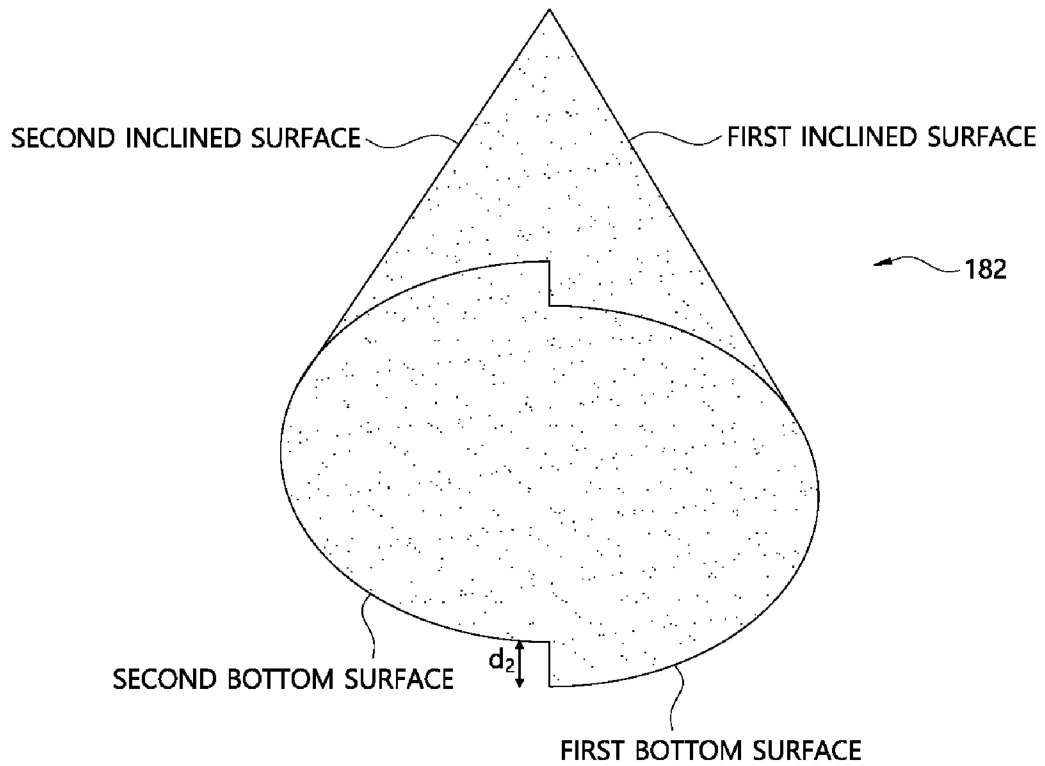
FIGS. 9 and 10 are views showing in detail a lower part of a valve of the raw material supply unit of FIG. 8.
Figure 10:
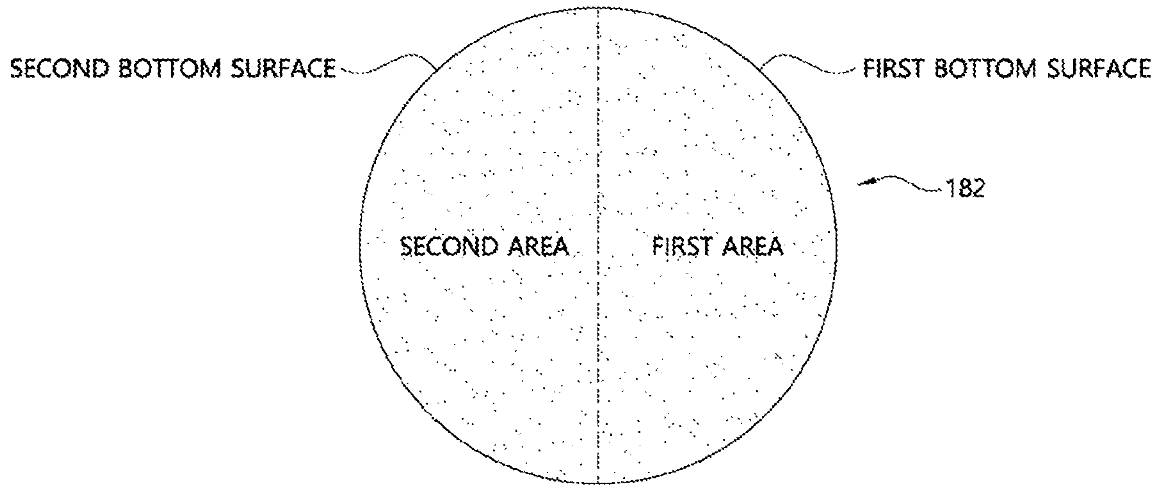

FIGS. 9 and 10 are views showing in detail a lower part of the valve of the raw material supply unit of FIG. 8.

FIG. 9 is a perspective view of the lower part of the valve 182, and FIG. 10 is a bottom view of the valve 182. As shown, the lower part of the valve 182 has a step structure. When the section of the valve 182 in the lateral direction, i.e. the horizontal direction, is circular, each of the first bottom surface and the second bottom surface may have a semicircular shape. In FIG. 10, a first area of the first bottom surface of the lower surface of the valve 182 and a second area of the second bottom surface of the lower surface of the valve may be equal to each other. That is, when a second weight of the raw material is supplied to the crucible 200 through the second portion after a first weight of the raw material is supplied to the crucible 200 through the first portion, the first weight and the second weight may be equal to each other.

Figure 11:
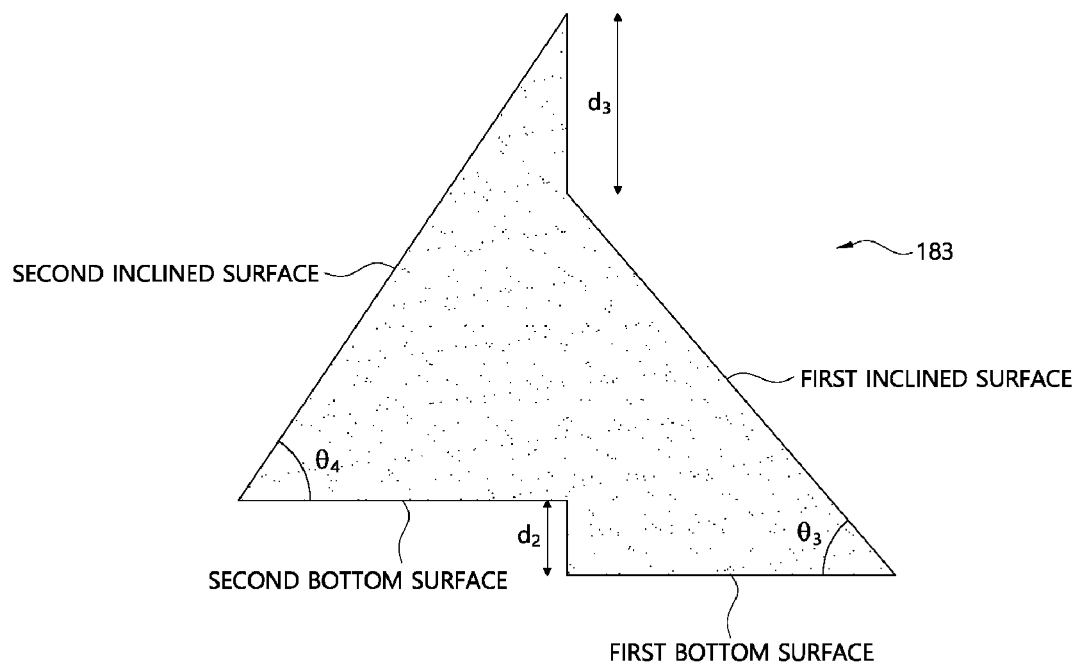
FIG. 11 is a view showing a part of a fifth embodiment of the raw material supply unit.

FIG. 11 is a view showing a part of a fifth embodiment of the raw material supply unit. This embodiment is identical to the fourth embodiment of the raw material supply unit of FIG. 8 except that a valve 183 having a different structure is provided.

That is, a third angle θ3 between a first inclined surface and a first bottom surface of the valve 183 and a fourth angle θ4 between a second inclined surface and a second bottom surface of the valve may be different from each other. Specifically, the fourth angle θ4 may be greater than the third angle θ3. Consequently, a height difference d3 between the highest point of the first inclined surface and the highest point of the second inclined surface of the valve 183 may be greater than a height difference d2 between the first bottom surface and the second bottom surface of the valve.

At this time, a raw material is completely supplied to the crucible located thereunder through the first inclined surface, and the raw material is completely supplied to the crucible through the second inclined surface. When the raw material is completely supplied to the crucible located thereunder through the first inclined surface, the raw material, i.e. polysilicon, may be relatively evenly distributed over the entire region of the surface of the silicon melt stored in the crucible, since the crucible is rotated when the raw material is supplied to the crucible. Consequently, when the raw material is supplied through the second inclined surface, which has a relatively great angle of inclination, the dropping speed of the raw material may be relatively high, and therefore raw material supply time may be shortened. At this time, since polysilicon is distributed on the surface of the silicon melt, splashing of the silicon melt due to polysilicon that drops may be prevented.

In another embodiment of the raw material supply unit, the lower surface of the valve 182 or 183 may have a step structure, wherein two portions having different heights may not be included but three or four portions having different heights may be provided.

When the three portions are provided, a first portion to a third portion may have different heights. In addition, as in the second embodiment, a first inclined surface to a third inclined surface that overlap the first bottom surface to the third bottom surface in the vertical direction, respectively, may be provided, and when the height is gradually increased from the first bottom surface to the third bottom surface, an angle of inclination may be gradually increased from the first inclined surface to the third inclined surface corresponding respectively thereto.

Figure 12:
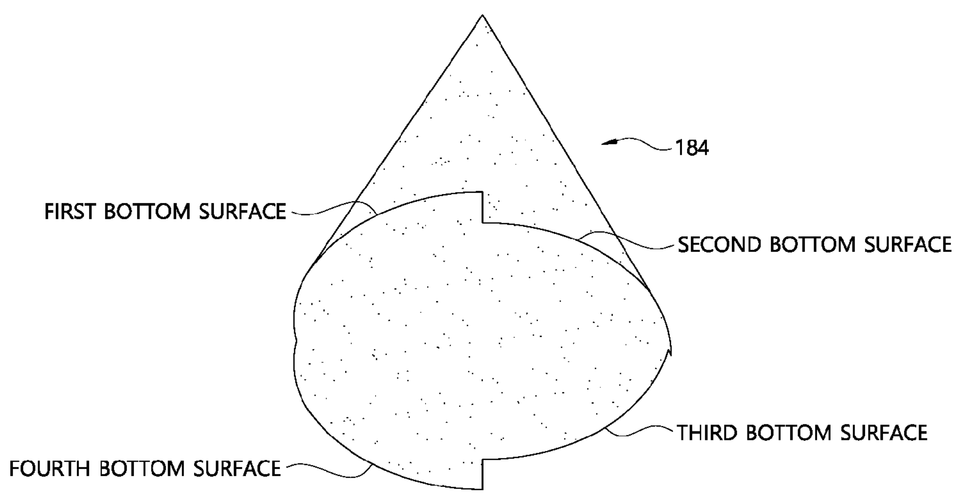
FIG. 12 is a view showing a part of a sixth embodiment of the raw material supply unit.
Figure 12:
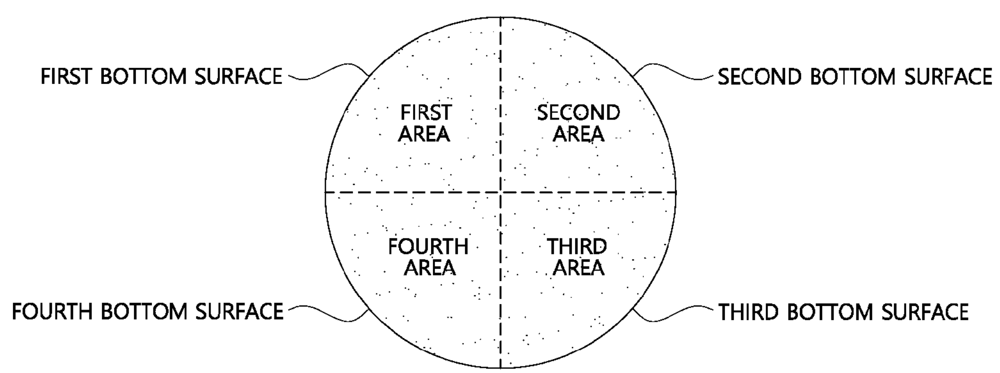

FIG. 12 is a view showing a part of a sixth embodiment of the raw material supply unit, specifically a lower part of a valve 184.

An upper figure is a perspective view of the lower part of the valve 184, and a lower figure is a bottom view of the valve 184.

As shown, the lower part of the valve 184 has a step structure. When the section of the valve 184 in the lateral direction, i.e. the horizontal direction, is circular, each of first to fourth bottom surfaces may have a fan shape having a central angle of 90 degrees (°), and first to fourth areas of a lower part of a body surrounded by first to fourth inclined surfaces, respectively, may be equal to each other. That is, when a second weight of a raw material is supplied to the crucible 200 through the second inclined surface and the fourth inclined surface after a first weight of the raw material is supplied to the crucible 200 through the first inclined surface and the third inclined surface, the first weight and the second weight may be equal to each other. At this time, a partition may be provided in the body 110 to divide an inner space of the body 110 into four regions corresponding to the first to fourth inclined surfaces in the horizontal direction.

FIGS. 13A to 13D are views showing a first embodiment of a raw material supply method according to the present disclosure.

In this embodiment, a method of supplying a raw material to the single-crystal silicon ingot growth apparatus using the first embodiment of the raw material supply unit shown in FIG. 3 is provided. Specifically, a method of supplying a raw material from the raw material supply unit, configured such that the bottom surface of the valve is flat and the lower surface of the body has a step, to the crucible is provided.

Figure 13A:
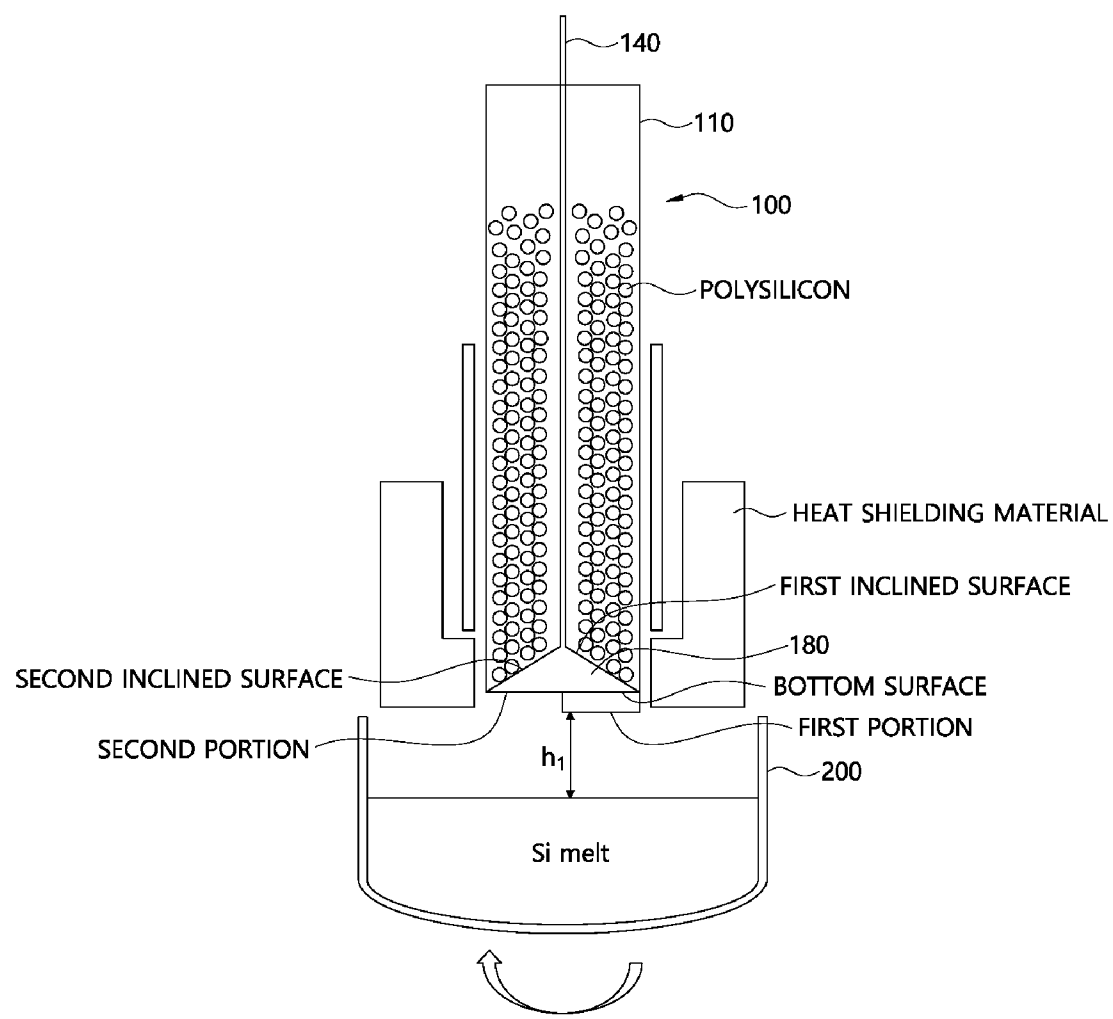
FIGS. 13A to 13D are views showing a first embodiment of a raw material supply method according to the present disclosure.

First, as shown in FIG. 13A, the raw material supply unit 100 is moved downwards in a direction toward silicon melt (Si melt) received in the crucible 200 while the crucible is rotated. At this time, the lower part of the raw material supply unit 100 may be moved downwards to a first height h1 from the surface of the silicon melt (Si melt). At this time, the first height h1 may be about 150 mm, the body 110 may be filled with polysilicon, and the inner space of the body 110 may be divided in the vertical direction by the partition (not shown).

Figure 13B:
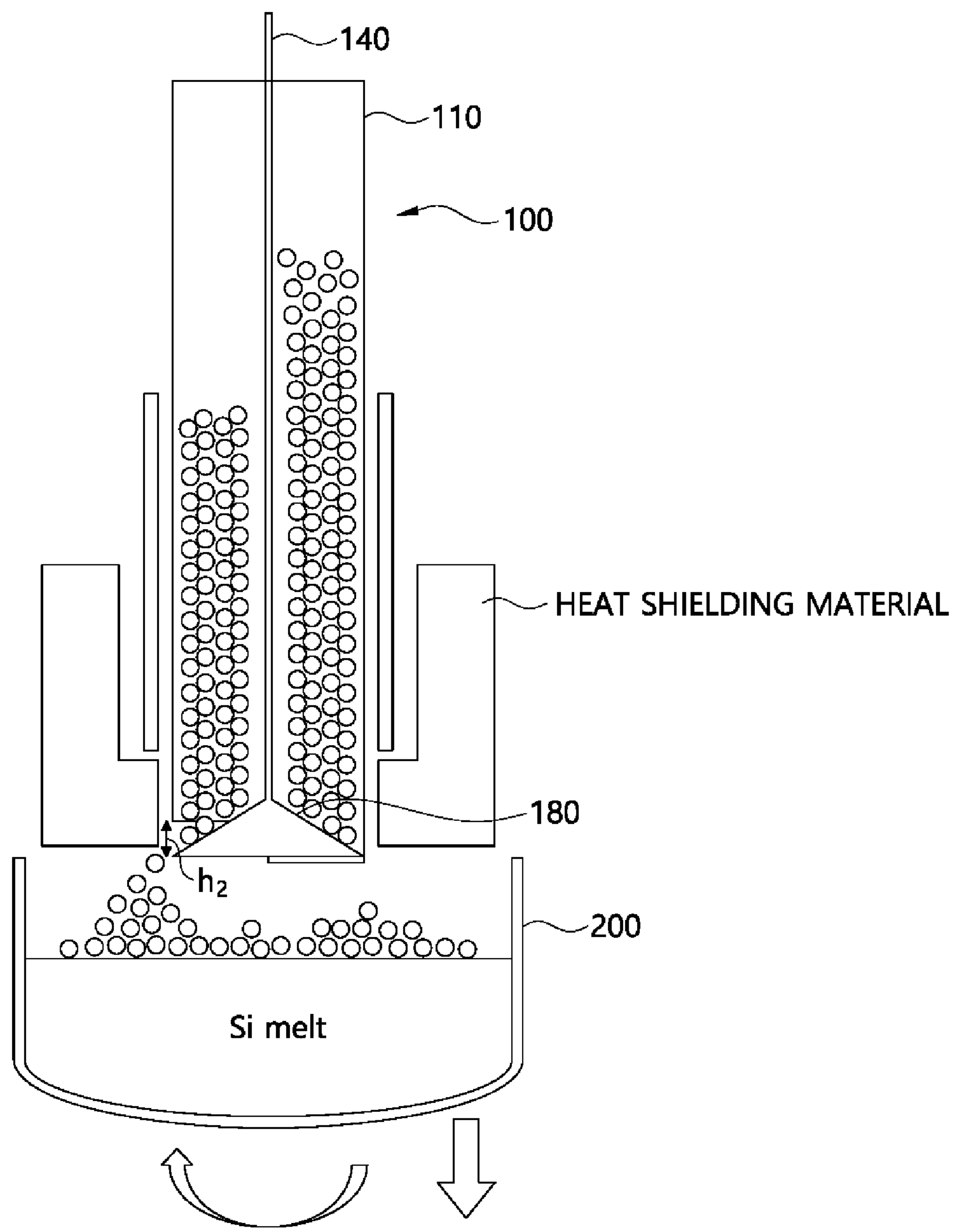

As shown in FIG. 13B, the valve 180 is moved downwards in a direction toward the crucible 200 as the result of downward movement of the rod 140. At this time, when the bottom surface of the valve 180 is moved downwards to a lower position than the second portion of the lower surface of the body 110, the polysilicon may drop through the gap between the second portion of the lower surface of the body 110 and the second inclined surface of the valve 180. At this time, the bottom surface of the valve 180 may be moved downwards by a second height h2 from the second portion of the lower surface of the body 110. Here, the second height h2 may be 30 to 70 mm. If the second height h2 is greater than 70 mm, the polysilicon above the second portion of the lower surface of the body 110 may drop too fast into the crucible 200, whereby the silicon melt (Si melt) may splash at the surface thereof. If the second height h2 is less than 30 mm, the space between the lower surface of the valve 180 and the second portion of the lower surface of the body 110 is too narrow, whereby the polysilicon may not be smoothly supplied.

In FIG. 13B, during supply of the polysilicon to the crucible 200, the polysilicon may be melted in the silicon melt (Si melt) in the crucible 200, whereby the surface of the silicon melt (Si melt) may rise. In the process of FIG. 13B, therefore, the crucible 200 may be moved downwards in order to prevent splashing of the silicon melt (Si melt) at the surface thereof.

Figure 13C:
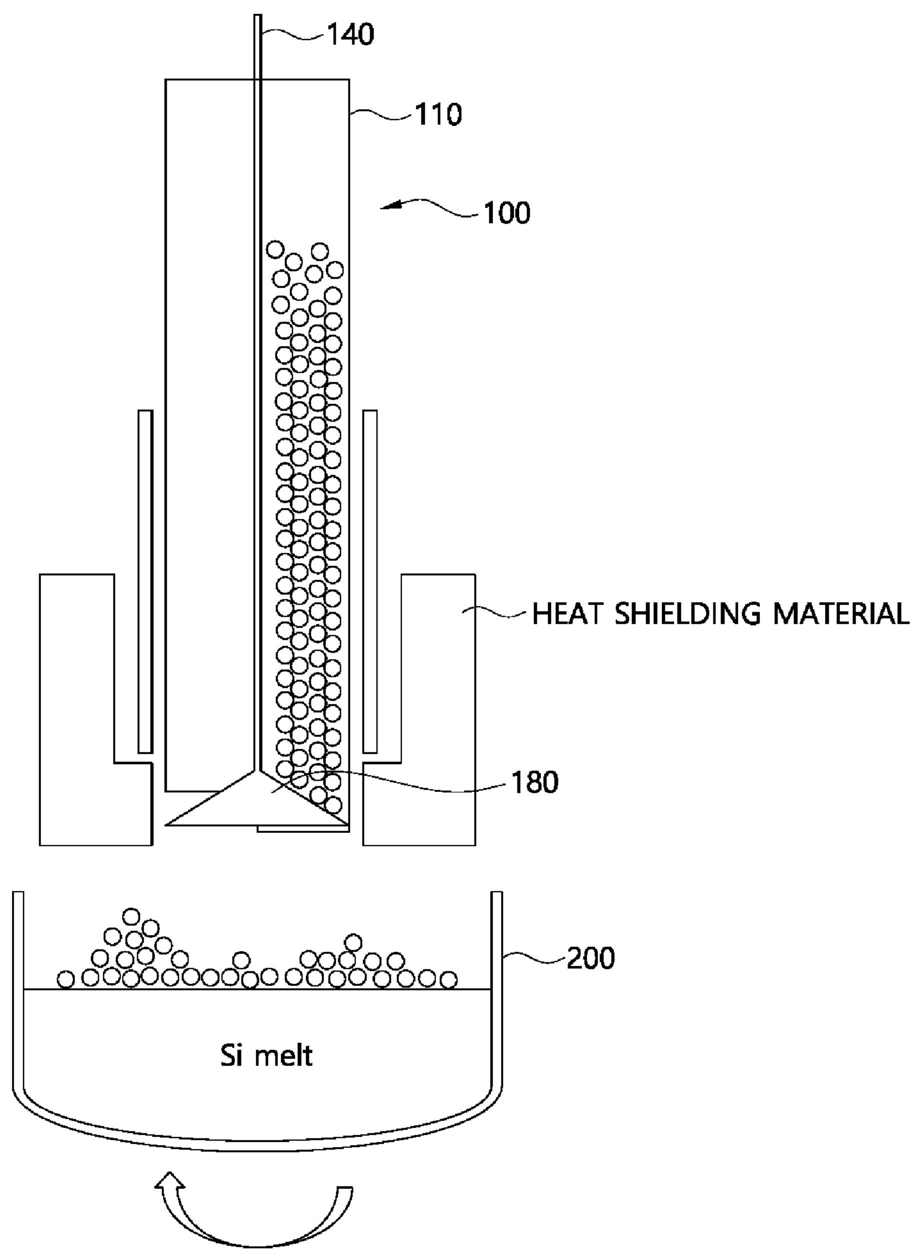
Figure 13D:
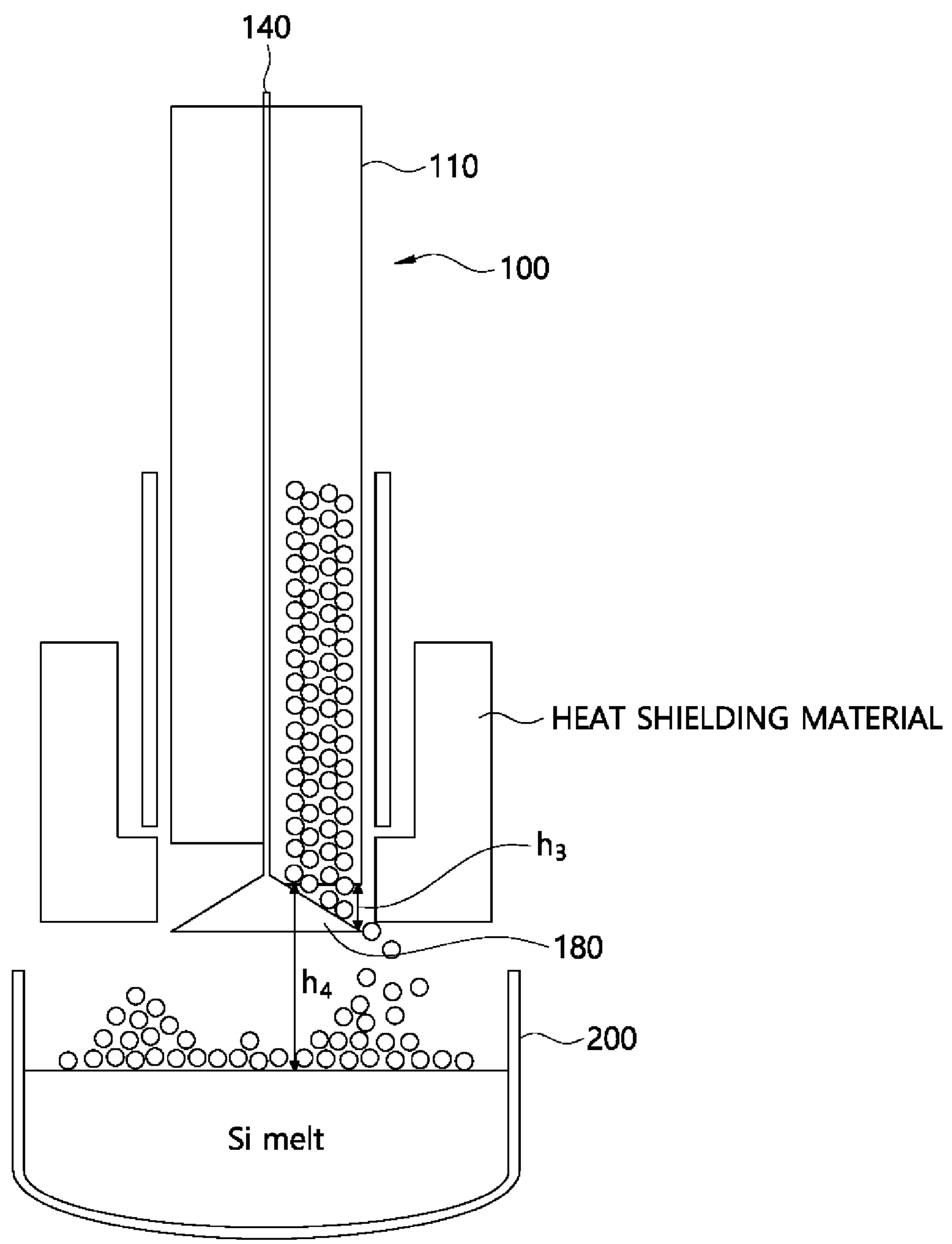

When the polysilicon above the second portion of the lower surface of the body 110 is completely supplied to the crucible 200, as shown in FIG. 13C, the rod 140 is further moved downwards and thus the valve 180 is moved downwards in the direction toward the crucible 200 again, as shown in FIG. 13D. At this time, when the bottom surface of the valve 180 is moved downwards to a lower position than the first portion of the lower surface of the body 110, the polysilicon may drop through the gap between the first portion of the lower surface of the body 110 and the first inclined surface of the valve 180. At this time, the bottom surface of the valve 180 may be moved downwards by a third height h3 from the first portion of the lower surface of the body 110. Here, the third height h3 may be 30 to 70 mm. In addition, the lower part of the raw material supply unit 100 may be located at a fourth height h4 from the surface of the silicon melt (Si melt). At this time, the fourth height h4 may be about 200 mm. Since the valve 180 is disposed lower than in FIG. 13A, the fourth height h4 may be set to be greater than the first height h1 of FIG. 13A in order to sufficiently secure the distance between the surface of the silicon melt (Si melt) and the lower surface of the valve 180.

In a process shown in FIG. 13D, the polysilicon stored above the first portion of the lower surface of the body 110 may be completely supplied to the silicon melt (Si melt) in the crucible 200.

FIGS. 14A to 14D are views showing a second embodiment of the raw material supply method according to the present disclosure.

In this embodiment, a method of supplying a raw material to the single-crystal silicon ingot growth apparatus using the fourth embodiment of the raw material supply unit shown in FIG. 8 is provided. Specifically, a method of supplying a raw material from the raw material supply unit, configured such that the lower surface of the body 110 is flat while having no step and the bottom surface of the valve 182 has a step, to the crucible is provided.

Figure 14A:
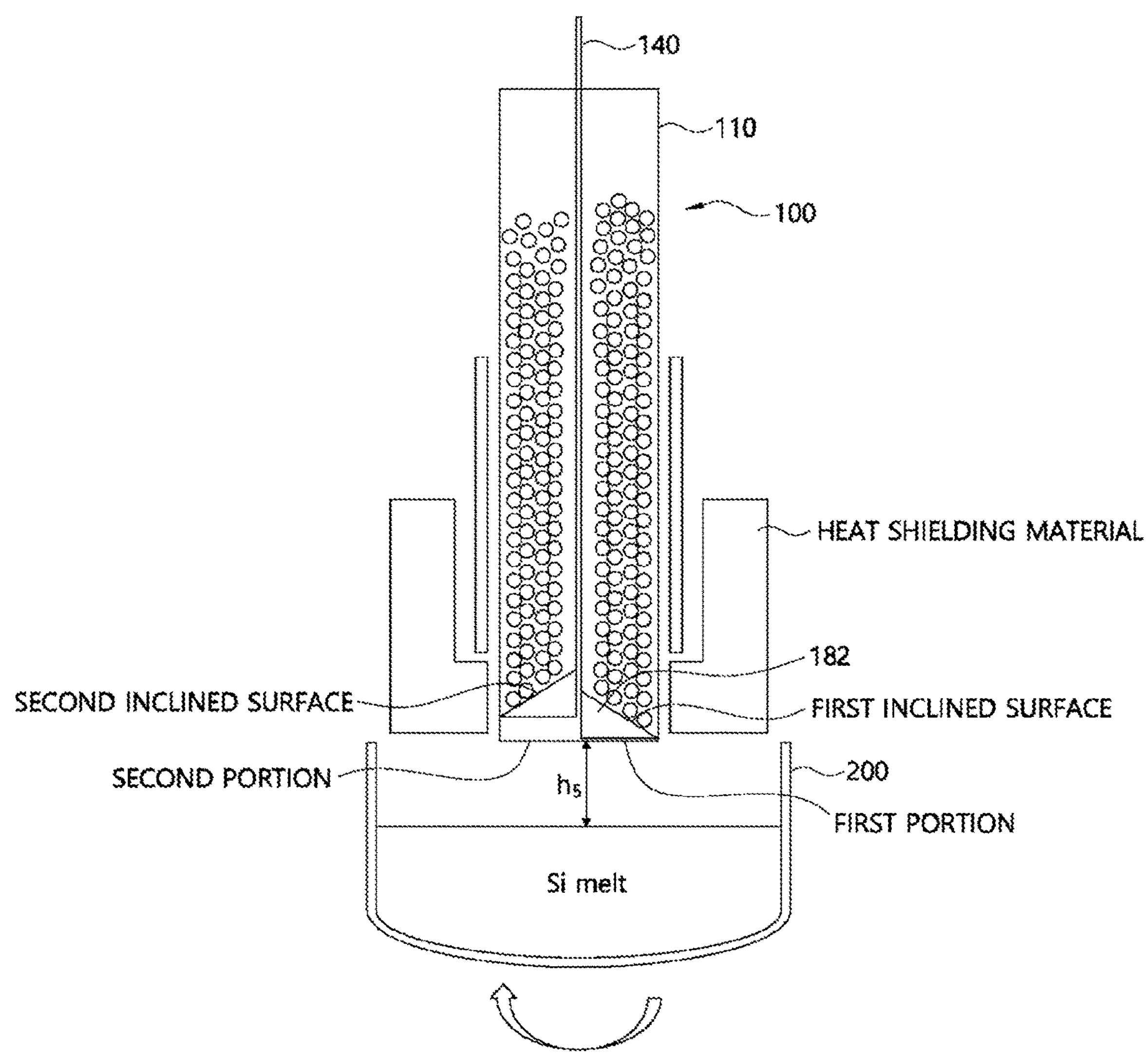
FIGS. 14A to 14D are views showing a second embodiment of the raw material supply method according to the present disclosure.

First, as shown in FIG. 14A, the raw material supply unit 100 is moved downwards in a direction toward silicon melt (Si melt) received in the crucible 200 while the crucible is rotated. At this time, the lower part of the raw material supply unit 100 may be moved downwards to a fifth height h5 from the surface of the silicon melt (Si melt). At this time, the fifth height h5 may be about 150 mm, the body 110 may be filled with polysilicon, and the inner space of the body 110 may be divided in the vertical direction by the partition (not shown). In addition, the first bottom surface of the valve 182 may be located at the same height as the lower surface of the body 110.

Figure 14B:
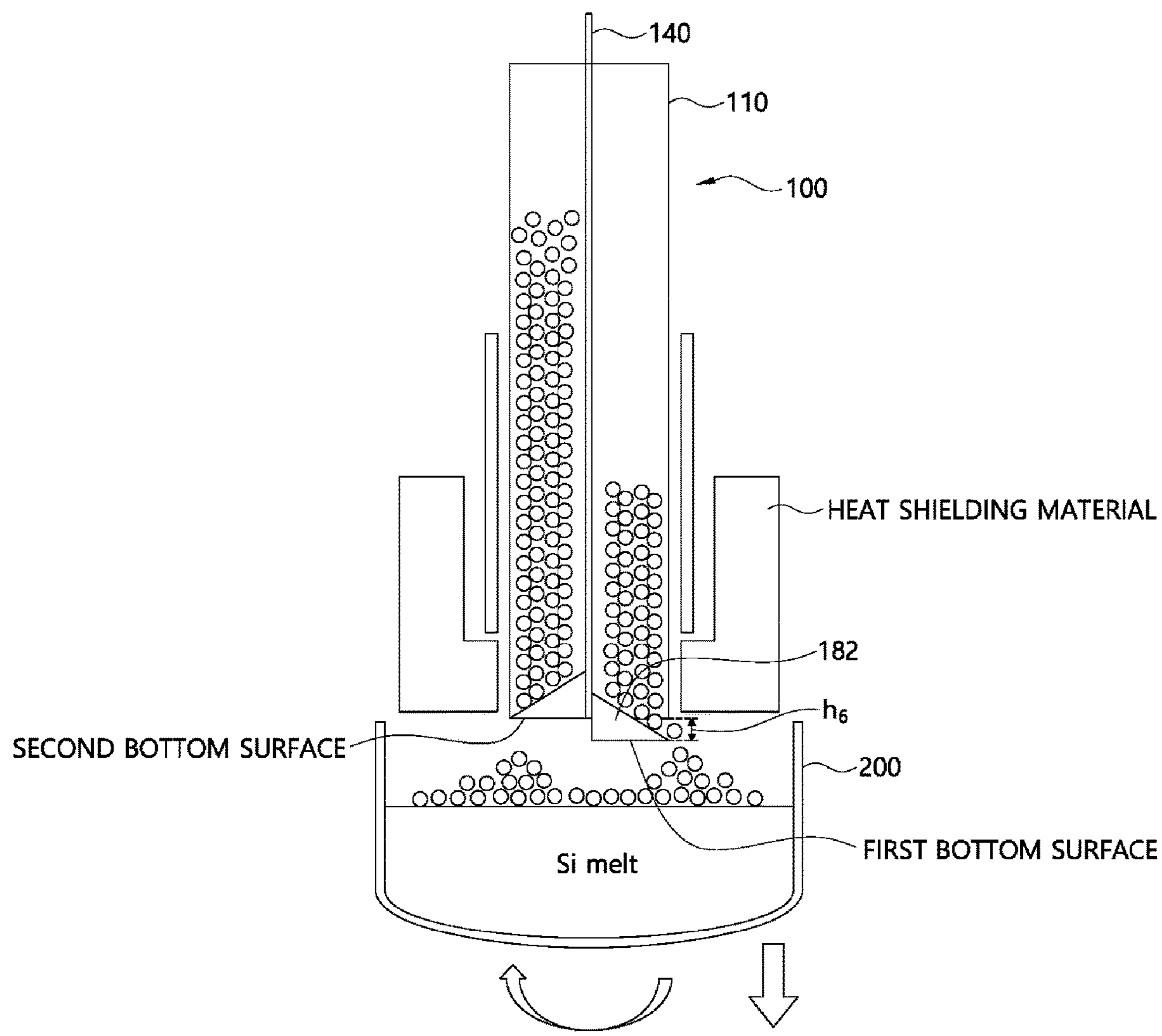

As shown in FIG. 14B, the valve 182 is moved downwards in a direction toward the crucible 200 as the result of downward movement of the rod 140. At this time, when the first bottom surface of the valve 182 is moved downwards to a lower position than the first portion of the lower surface of the body 110, the polysilicon may drop through the gap between the first portion of the lower surface of the body 110 and the first inclined surface of the valve 182. At this time, the first portion of the first bottom surface of the valve 182 may be moved downwards by a sixth height h6 from the lower surface of the body 110. Here, the sixth height h6 may be 30 to 70 mm. If the sixth height h6 is greater than 70 mm, the polysilicon above the first bottom surface of the valve 182 may drop too fast into the crucible 200, whereby the silicon melt (Si melt) may splash at the surface thereof. If the sixth height h6 is less than 30 mm, the space between the inclined surface above the first bottom surface of the valve 182 and the first portion of the lower surface of the body 110 is too narrow, whereby the polysilicon may not be smoothly supplied.

In FIG. 14B, during supply of the polysilicon to the crucible 200, the polysilicon may be melted in the silicon melt (Si melt) in the crucible 200, whereby the surface of the silicon melt (Si melt) may rise. In the process of FIG. 14B, therefore, the crucible 200 may be moved downwards in order to prevent splashing of the silicon melt (Si melt) at the surface thereof.

Figure 14C:
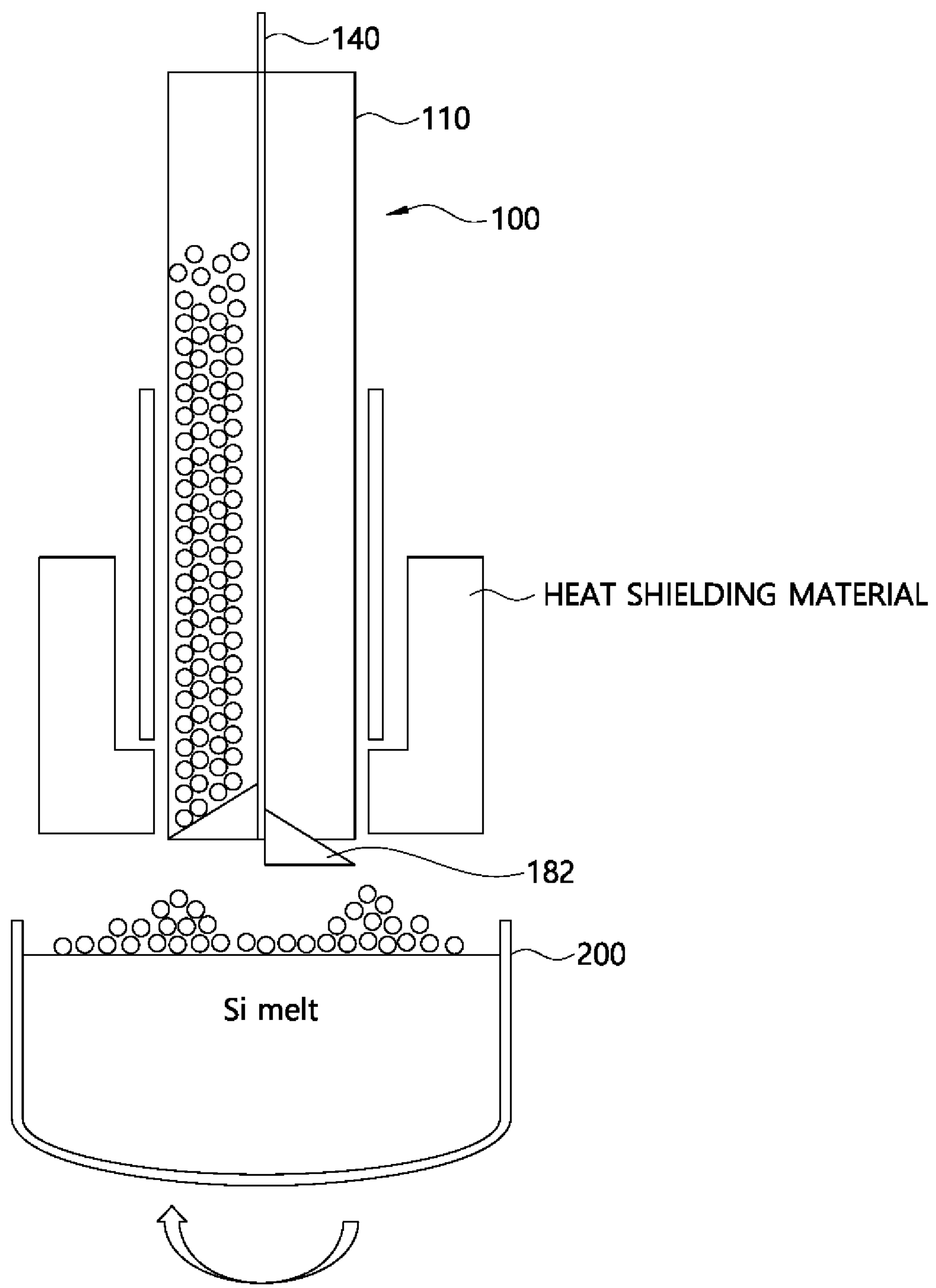
Figure 14D:
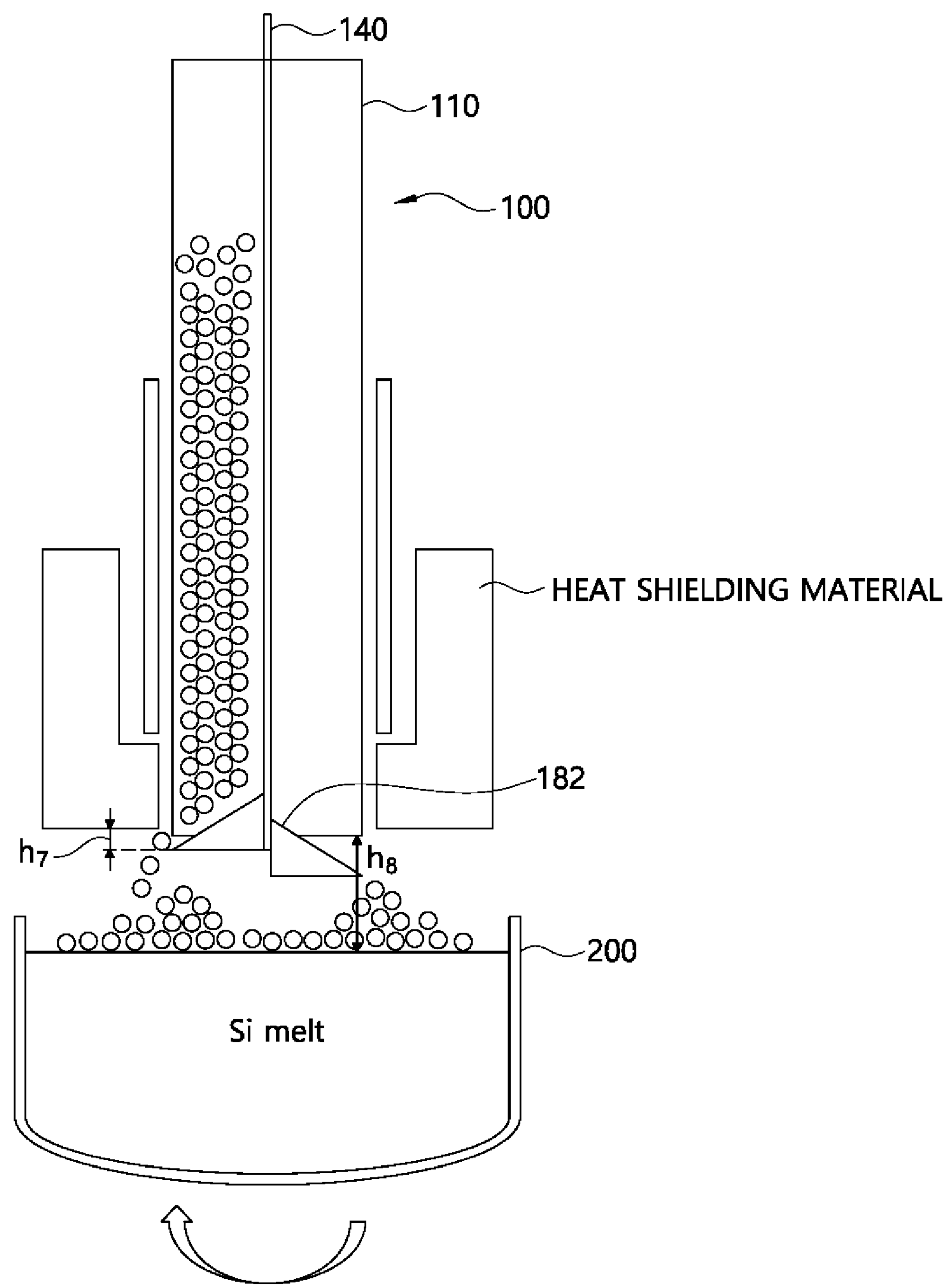

When the polysilicon above the first portion of the bottom surface of the valve 182 is completely supplied to the crucible 200, as shown in FIG. 14C, the rod 140 is further moved downwards and thus the valve 182 is moved downwards in the direction toward the crucible 200 again, as shown in FIG. 14D. At this time, when the second bottom surface of the valve 182 is moved downwards to a lower position than the lower surface of the body 110, the polysilicon may drop through the space between the second portion of the lower surface of the body 110 and the second inclined surface of the valve 182. At this time, the second bottom surface of the valve 182 may be moved downwards by a seventh height h7 from the lower surface of the body 110. Here, the seventh height h7 may be 30 to 70 mm. In addition, the lower part of the raw material supply unit 100 may be located at an eighth height h8 from the surface of the silicon melt (Si melt). At this time, the eighth height h8 may be about 200 mm. Since the valve 182 is disposed lower than in FIG. 14A, the eighth height h8 may be set to be greater than the fifth height h5 of FIG. 14A in order to sufficiently secure the distance between the surface of the silicon melt (Si melt) and the bottom surface of the valve 182.

In a process shown in FIG. 14D, the polysilicon stored above the second bottom surface of the valve 182 may be completely supplied to the silicon melt (Si melt) in the crucible 200.

In the raw material supply unit according to the embodiment and the single-crystal silicon ingot growth apparatus including the same, a raw material may be supplied through some regions and then the raw material may be supplied through other regions using a body having a larger volume than before, whereby the raw material supply unit may not be replaced during supply of the raw material or the raw material supply unit may not be refilled with a raw material, and therefore a raw material supply process may be simplified and process time may be shortened.

Although embodiments have been described with reference to the drawings, it should be understood that the present disclosure is not limited to the above embodiments and various modifications and alterations are possible by those skilled in the art to which the present disclosure pertains.

Therefore, the scope of the present disclosure is not defined by the embodiments described above but is defined by the accompanying claims and equivalents thereto.

INDUSTRIAL APPLICABILITY

A raw material supply unit according to an embodiment and a single-crystal silicon ingot growth apparatus including the same may be used to manufacture a silicon substrate used to manufacture a semiconductor device, a solar cell, etc.

The invention claimed is:

1. A raw material supply unit comprising:

a body having a space configured to be filled with a raw material;

a partition configured to divide the body in a longitudinal direction to form at least two regions within an inner region of the body, a first one of the at least two regions formed on a first side of the partition and a second one of the at least two regions formed on a second side of the partition;

a rod extending from above the body to the inner region of the body so as to be disposed in the body; and a valve connected to the rod, the valve being configured to open and close a lower part of the body, wherein the lower part of the body forms an open area that includes at least a first open area and a second open area, wherein a lower surface of the body, which is different than a lower surface of the valve, comprises a first portion having a first height and a second portion having a second height greater than the first height, the first portion is part of a circumference of the first open area, the second portion is part of a circumference of the second open area, and the first open area is defined as part of the open area adjacent to the first portion, and the second open area is defined as part of the open area adjacent to the second portion, wherein a difference between the first height and the second height is 30 mm to 70 mm, wherein a border between the first portion and the second portion is to extend to vertically overlap with the partition, wherein the valve has a conical shape, the conical shape comprises a first inclined surface and a second inclined surface, and wherein the valve is configured to move up and down within the open area of the body, the first inclined surface of the valve overlaps the first open area in a vertical direction, and the second inclined surface of the valve overlaps the second open area in the vertical direction.

2. The raw material supply unit according to claim 1, wherein a second angle between a bottom surface of the valve and the second inclined surface is less than or equal to a first angle between the bottom surface of the valve and the first inclined surface.

3. The raw material supply unit according to claim 1, wherein the lower surface of the body further comprises a third portion having the first height and a fourth portion having the second height, the first portion and the third portion are disposed in symmetry with respect to a center of the body in a horizontal direction, and the second portion and the fourth portion are disposed in symmetry with respect to the center of the body in the horizontal direction.

* * * * *